United States Patent
Nakamura et al.

(10) Patent No.: US 11,506,555 B2
(45) Date of Patent: Nov. 22, 2022

(54) PIEZOELECTRIC SENSOR

(71) Applicants: CITIZEN FINEDEVICE CO., LTD., Yamanashi (JP); CITIZEN WATCH CO., LTD., Nishitokyo (JP)

(72) Inventors: Rikoku Nakamura, Minamitsuru-gun (JP); Masanori Yomoyama, Minamitsuru-gun (JP)

(73) Assignees: CITIZEN FINEDEVICE CO., LTD., Yamanashi (JP); CITIZEN WATCH CO., LTD., Tokyo (JP)

(*) Notice: Subject to any disclaimer, the term of this patent is extended or adjusted under 35 U.S.C. 154(b) by 1100 days.

(21) Appl. No.: 16/086,402

(22) PCT Filed: Mar. 21, 2017

(86) PCT No.: PCT/JP2017/011258
§ 371 (c)(1),
(2) Date: Sep. 19, 2018

(87) PCT Pub. No.: WO2017/164183
PCT Pub. Date: Sep. 28, 2017

(65) Prior Publication Data
US 2019/0086281 A1    Mar. 21, 2019

(30) Foreign Application Priority Data
Mar. 24, 2016    (JP) .............................. JP2016-060213

(51) Int. Cl.
*G01L 9/06* (2006.01)
*G01L 27/00* (2006.01)
(Continued)

(52) U.S. Cl.
CPC .................. *G01L 9/06* (2013.01); *G01L 9/08* (2013.01); *G01L 23/10* (2013.01); *G01L 27/002* (2013.01);
(Continued)

(58) Field of Classification Search
CPC ... G01L 9/06; G01L 9/08; G01L 23/10; G01L 27/002; G01L 27/005; H01L 41/1132
See application file for complete search history.

(56) References Cited

U.S. PATENT DOCUMENTS 4,951,236 A    8/1990    Kawate et al.
4,982,351 A    1/1991    Kawate et al.
(Continued)

FOREIGN PATENT DOCUMENTS

CN    1293481 A    5/2001
CN    1444796 A    9/2003
(Continued)

OTHER PUBLICATIONS

Oct. 2, 2019 Search Report issued in European Patent Application No. 17770225.5.
(Continued)

*Primary Examiner* — Ryan D Walsh
(74) *Attorney, Agent, or Firm* — Oliff PLC

(57) ABSTRACT

In piezoelectric sensors, conventional amplification factor adjustment methods involving the cutting of a wiring pattern or use of a laser trimmable resistor are unable to adjust the amplification factor when the sensor is in a completed state. As a result, the production process becomes complex and production costs increase. Further, because the amplification factor adjustment is carried out in a different state from that of the finished product, the problem that the amplification factor is not set correctly in the finished product also occurs. A non-volatile memory is incorporated in an integrated circuit in which there are integrated piezoelectric sensor circuit elements. The amplification factor is adjusted by writing data from a writing terminal to change an amplification resistor a.

3 Claims, 12 Drawing Sheets

(51) Int. Cl.
*H01L 41/113* (2006.01)
*G01L 23/10* (2006.01)
*G01L 9/08* (2006.01)

(52) U.S. Cl.
CPC ........ *G01L 27/005* (2013.01); *H01L 41/1132* (2013.01)

(56) References Cited

U.S. PATENT DOCUMENTS

| | | |
|---|---|---|
| 5,051,937 A | 9/1991 | Kawate et al. |
| 5,461,584 A | 10/1995 | Ikuta et al. |
| 6,304,474 B1 | 10/2001 | Shinkawa |
| 6,424,211 B1 | 7/2002 | Nolan et al. |
| 2004/0027872 A1 | 2/2004 | Nishikawa et al. |
| 2016/0033981 A1 | 2/2016 | Harada et al. |
| 2017/0153161 A1 | 6/2017 | Yomoyama |

FOREIGN PATENT DOCUMENTS

| | | | |
|---|---|---|---|
| CN | 105320201 A | | 2/2016 |
| EP | 0245031 A2 | * | 11/1987 |
| EP | 0578252 A2 | | 1/1994 |
| JP | 2720718 B2 | | 3/1998 |
| JP | 2896371 B2 | | 5/1999 |
| JP | H11-148878 A | | 6/1999 |
| JP | 2005-308503 A | | 11/2005 |
| JP | 2006-078379 A | | 3/2006 |
| JP | 2009-115484 A | | 5/2009 |
| JP | 2010154394 A | * | 7/2010 |
| JP | 2013140048 A | * | 7/2013 |
| JP | 2014-102115 A | | 6/2014 |
| WO | 2013-115124 A1 | | 8/2013 |
| WO | 2015-147059 A1 | | 10/2015 |
| WO | WO-2015147058 A1 | * | 10/2015 ............ F02D 35/023 |
| WO | WO-2015147060 A1 | * | 10/2015 ............. G01L 23/10 |

OTHER PUBLICATIONS

Apr. 18, 2017 International Search Report issued in International Patent Application No. PCT/JP2017/011258.
Wang et al; "Practical Electronic Circuit Manual"; Scientific and Technical Documentation Press; Sep. 1992; vol. 1; pp. 252-254.
Feb. 21, 2019 Decision to Grant a Patent issued in Japanese Patent Application No. 2018-507342.

* cited by examiner

PIEZOELECTRIC SENSOR

TECHNICAL FIELD

The present invention relates to a piezoelectric sensor that measures a physical amount by a piezoelectric element, integrates a current signal of the measurement result, and amplifies and outputs thereof.

BACKGROUND ART

A piezoelectric sensor using a piezoelectric element that generates charges in response to a physical deformation amount is excellent in sensitivity and has accuracy that is not deteriorated even in high-temperature environment; therefore, the piezoelectric sensor is often used as a sensor for measuring combustion pressure of an engine.

FIG. 3 is a diagram showing a specific example of a configuration of a conventional piezoelectric sensor. In FIG. 3, reference numeral 301 denotes a piezoelectric element, 302 denotes a DC breaking capacity, 303 denotes a discharging resistor, 304 denotes a charging capacity, 305 denotes an integrating operation amplifier, 312 denotes a feedback terminal, 313 denotes a signal output terminal, 315 denotes a signal input terminal, 306 denotes a reference voltage source, 307 denotes an amplification resistor a, 308 denotes an amplification resistor b, 309 denotes an amplifying operation amplifier, and 310 denotes an integrated circuit.

The piezoelectric element 301 includes a pair of electrodes on a surface thereof, to output a charge signal from the electrodes in response to a stress applied to the piezoelectric element 301. In the piezoelectric element 301, since a configuration routing a wire from the electrodes and inputting thereof to a circuit block becomes highly complicated, as shown in FIG. 3, a configuration in which one of the electrodes is grounded and the signal is taken from the other electrode is used in general. The other electrode is connected to a negative-side input terminal of the integrating operation amplifier 305 via the DC breaking capacity 302.

In the integrating operation amplifier 305, between the negative-side input terminal and the output terminal, the charging capacity 304 and the discharging resistor 303 are connected in parallel, and the reference voltage source 306 is connected to a positive-side input terminal; accordingly, an integrating circuit is constituted by the integrating operation amplifier 305, the charging capacity 304 and the discharging resistor 303.

An AC charge signal outputted from the piezoelectric element 301 is accumulated, via the DC breaking capacity 302 for cutting the DC component, in the charging capacity 304 provided between the input and output of the integrating operation amplifier 305, to be converted into an integrated voltage signal Vo1. Here, as the integrating operation amplifier 305, the one with high inputting impedance is used, and thereby it becomes possible to correctly detect even minute charge signal of the piezoelectric element 301. The discharging resistor 303 is provided to prevent the charging capacity 304 from being saturated when positive-negative balance in the AC charge signal is uneven, and it is necessary that a charge-discharge time constant determined by the charging capacity 304 and the discharging resistor 303 is sufficiently longer than a period of the detection signal.

The reference voltage source 306 is to apply a predetermined bias voltage to the integrating circuit and the amplifier circuit, and a voltage regulator circuit or the like utilizing a band-gap voltage of a transistor is generally used.

At a later stage of the integrating operation amplifier 305, there is provided the amplifier circuit that amplifies the output signal Vo1 of the integrating operation amplifier 305 to output an output signal Vout of the piezoelectric sensor. The amplifier circuit is constituted by the amplifying operation amplifier 309, the amplification resistor a 307 and the amplification resistor b 308, and has a configuration in which the amplification resistor b 308 is connected between the negative-side input terminal and the output terminal of the amplifying operation amplifier 309 and the reference voltage source 306 is connected to the positive-side input terminal via the amplification resistor a 307.

The circuit block can be configured with discrete components; however, in terms of space and costs, it is advantageous to form the circuit block into a single integrated circuit. In the conventional example shown in FIG. 3, the integrating operation amplifier 305, the amplifying operation amplifier 309, the reference voltage source 306, the amplification resistor a 307 and the amplification resistor b 308 are formed into an integrated circuit to be configured as the integrated circuit 310. Even when the circuit block is formed into a single integrated circuit, it is in general that the charging capacity 304 and the discharging resistor 303 are provided outside the integrated circuit 310. This is because, as usual, it is difficult to form the charging capacity 304 and the discharging resistor 303 inside the integrated circuit 310 due to their large values. At connection points between the integrated circuit 310 and the outside thereof, input-output terminals are provided; at the connection point between the integrating operation amplifier 305 and the piezoelectric element 301, there is provided the signal input terminal 315, at the connection point between the output of the integrating operation amplifier 305 and the discharging resistor 303, the charging capacity 304, there is provided the feedback terminal 312, and, at the connection point between the output of the amplifying operation amplifier 309 and the outside, there is provided the signal output terminal 313.

FIG. 5 is a diagram showing another specific example of the conventional piezoelectric sensor. The piezoelectric sensor includes a piezoelectric element 501, and an integrating circuit, a reference voltage source 506 and an amplifying operation amplifier 509 configured with an integrating operation amplifier 505, a discharging resistor 503 and a charging capacity 504. In the conventional example shown in FIG. 3, the charging capacity 304 and the discharging resistor 303 are provided between the input and output of the integrating operation amplifier 305; however, in the piezoelectric sensor shown in FIG. 5, the configuration is provided with the charging capacity 504 and the discharging resistor 503 between the positive-side input terminal of the integrating operation amplifier 505 and the reference voltage source 506. Moreover, in FIG. 3, the amplifier circuit is a normal direction amplifier circuit of a single-stage configuration; however, in this specific example, the amplifier circuit is configured as an inverting amplifier circuit of a single-stage configuration in which the output signal of the integrating operation amplifier 505 is inputted to a negative-side input terminal of the amplifying operation amplifier 509 via an amplification resistor a 507, an amplification resistor b 508 is connected between the negative-side input terminal and an output signal, and a positive-side input terminal is connected to the reference voltage source 506. The amplifier circuit can be configured in multiple stages.

CITATION LIST

Patent Literature

Patent Document 1: Japanese Patent Application Laid-Open Publication No. 2009-115484

SUMMARY OF INVENTION

Technical Problem

It is necessary to suppress variations in measurement sensitivity of the output signal Vout of the piezoelectric sensor in each product as small as possible. However, regarding the magnitude of charge signals generated from the piezoelectric element, a relatively large difference occurs in the generated charges due to a slight difference in a production process of piezoelectric element crystals or processing accuracy thereof, and accordingly, it is difficult to satisfy an accuracy required for the output signal Vout of the piezoelectric sensor.

Therefore, it is performed in general that the accuracy in the output signal Vout is secured by providing an adjustment mechanism for the amplification factor to the amplifier circuit to adjust the amplification factor in a sensor assembly process.

FIG. 4 shows a specific example of a ladder resistor for amplification factor adjustment configured with a resistor Rf and a four-stage resistor circuit (R1 to R4) connected thereto in series. By cutting the wiring of P1 to P4 of the resistor circuit in each stage, it is possible to set the 16 resistance values from the minimum Rf to the maximum Rf+R1+R2+R3+R4. Adjustment of the amplification factor can be performed by using the ladder resistor as the amplification resistor a, the amplification resistor b, or both, and cutting the wiring of P1 to P4 by laser or an end mill.

Moreover, there is also a method that uses a commercially available laser trimmable resistor to the amplification resistor a, the amplification resistor b, or both, to thereby adjust the resistance value by the laser.

However, these adjustment methods have a problem that the amplification factor cannot be adjusted in the state in which the sensor is completed. FIG. 6 is an exploded perspective view showing a structure of the combustion pressure sensor that is a specific example of the piezoelectric sensor. At a leading end portion of a front housing 603, there is provided a diaphragm head 601 for transmitting the combustion pressure to a piezoelectric element 604, and at a middle portion thereof, there is provided a fastening screw 602 for fastening the combustion pressure sensor to an engine. The piezoelectric element 604, a conductive wire 605, a circuit board 606 and a circuit case 607 are housed in the front housing 603 and a rear housing 609, and the front housing 603 and the rear housing 609 are welded to constitute the combustion pressure sensor.

When the adjustment of the amplification factor is performed by cutting of the board wiring or the laser trimmable resistor as described above, the circuit board 606 is required to be exposed to the outside; the adjustment of the amplification factor is performed in a semi-finished state in which the rear housing 609 is not attached, and thereafter, attachment and welding of the rear housing 609 is carried out.

The production procedures described above include complicated processes and result in increase of the production costs. Moreover, since the amplification factor adjustment is carried out in a different state from that of the finished product, the amplification factor in the state of the finished product sometimes differs from the amplification factor when being adjusted, and therefore, the problem that the amplification factor is not set correctly as desired also occurs.

Moreover, in general, the adjustment of the amplification factor is performed while actually applying pressure or the like to the sensor and monitoring the output; however, in the case of the above-described methods, the cut patterns or the written trimmable resistor is irreversible; accordingly, there is also a problem that the high-accuracy adjustment is difficult.

The present invention has been made to solve the above-described problem, and has an object to provide a piezoelectric sensor capable of adjusting an amplification factor or the like with high accuracy in a short time in a state of a finished product.

Solution to Problem

To solve the above-described problem, there is provided a piezoelectric sensor according to the present invention including: a piezoelectric element for detecting a pressure; an integrating circuit that integrates a current signal outputted from the piezoelectric element to convert the current signal into a voltage signal; an amplifier circuit that amplifies an output from the integrating circuit to output thereof to outside; a reference voltage source that prescribes an offset voltage of an output signal outputted from the amplifier circuit; a writable memory that stores information for setting an amplification factor of the amplifier circuit; and a writing terminal for writing the information to the memory, wherein the integrating circuit, the amplifier circuit, the reference voltage source and the memory are contained in a single integrated circuit.

In the piezoelectric sensor, the writing terminal is provided to an external-connection connector that connects the single integrated circuit and the outside.

Moreover, a piezoelectric sensor according to the present invention includes: a piezoelectric element for detecting a pressure; an integrating circuit that integrates a current signal outputted from the piezoelectric element to convert the current signal into a voltage signal; an amplifier circuit that amplifies an output from the integrating circuit to output thereof to outside; a reference voltage source that prescribes an offset voltage of an output signal outputted from the amplifier circuit; a writable memory that stores information for setting the offset voltage of the reference voltage source; and a writing terminal for writing the information to the memory, wherein the integrating circuit, the amplifier circuit, the reference voltage source and the memory are contained in a single integrated circuit.

In the piezoelectric sensor, the writing terminal is provided to an external-connection connector that connects the single integrated circuit and the outside.

Moreover, a piezoelectric sensor according to the present invention includes: a piezoelectric element for detecting a pressure; an integrating circuit that integrates a current signal outputted from the piezoelectric element to convert the current signal into a voltage signal; an amplifier circuit that amplifies an output from the integrating circuit to output thereof to outside; a reference voltage source that prescribes an offset voltage of an output signal outputted from the amplifier circuit; a clip circuit for limiting an output from the amplifier circuit within a prescribed range; a writable memory that stores information for setting a clip voltage of the clip circuit; and a writing terminal for writing the information to the memory, wherein the integrating circuit, the amplifier circuit, the reference voltage source, the clip circuit and the memory are contained in a single integrated circuit.

In the piezoelectric sensor, the writing terminal is provided to an external-connection connector that connects the single integrated circuit and the outside.

Advantageous Effects of Invention

According to the present invention, it is possible to provide a piezoelectric sensor capable of adjusting an amplification factor with high accuracy in a short time in a state of a finished product.

DESCRIPTION OF EMBODIMENTS

An exemplary embodiment of a piezoelectric sensor according to the present invention will be described based on drawings.

Example 1

Figure 1:
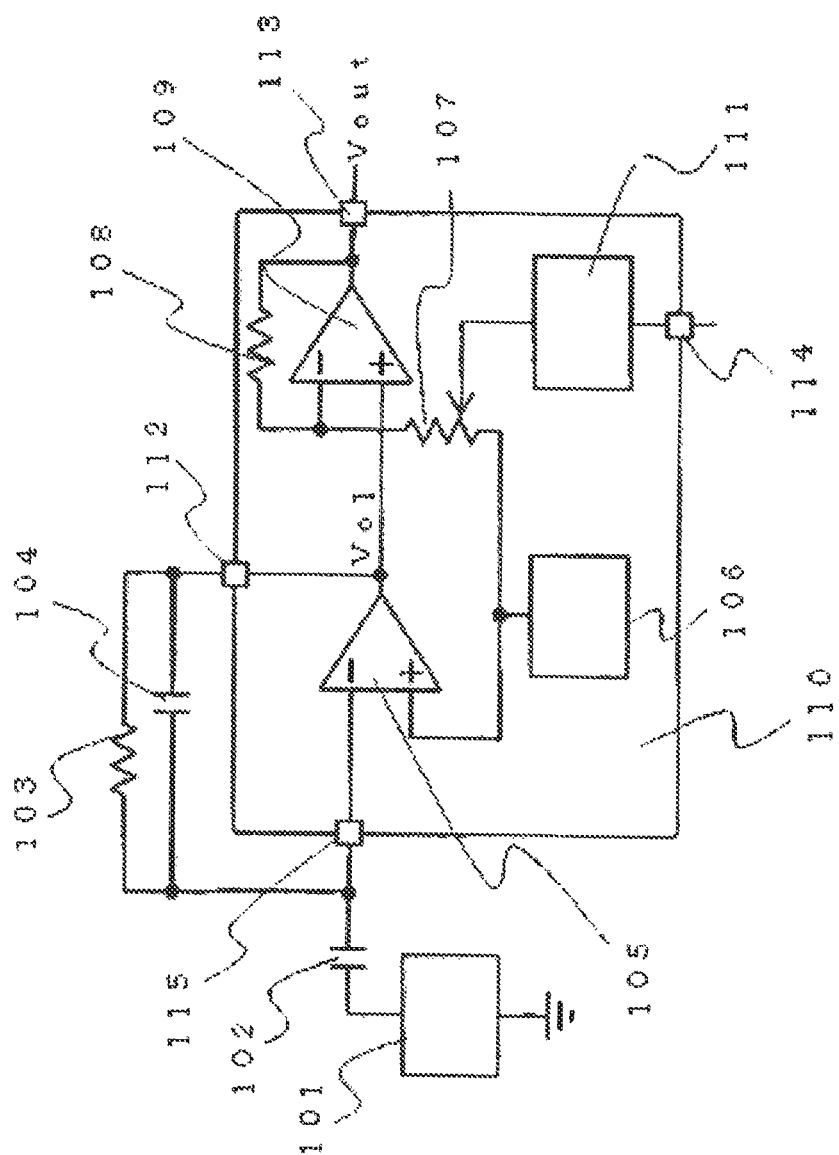
FIG. 1 is a diagram showing an example of a piezoelectric sensor according to the present invention (Example 1)
Figure 3:
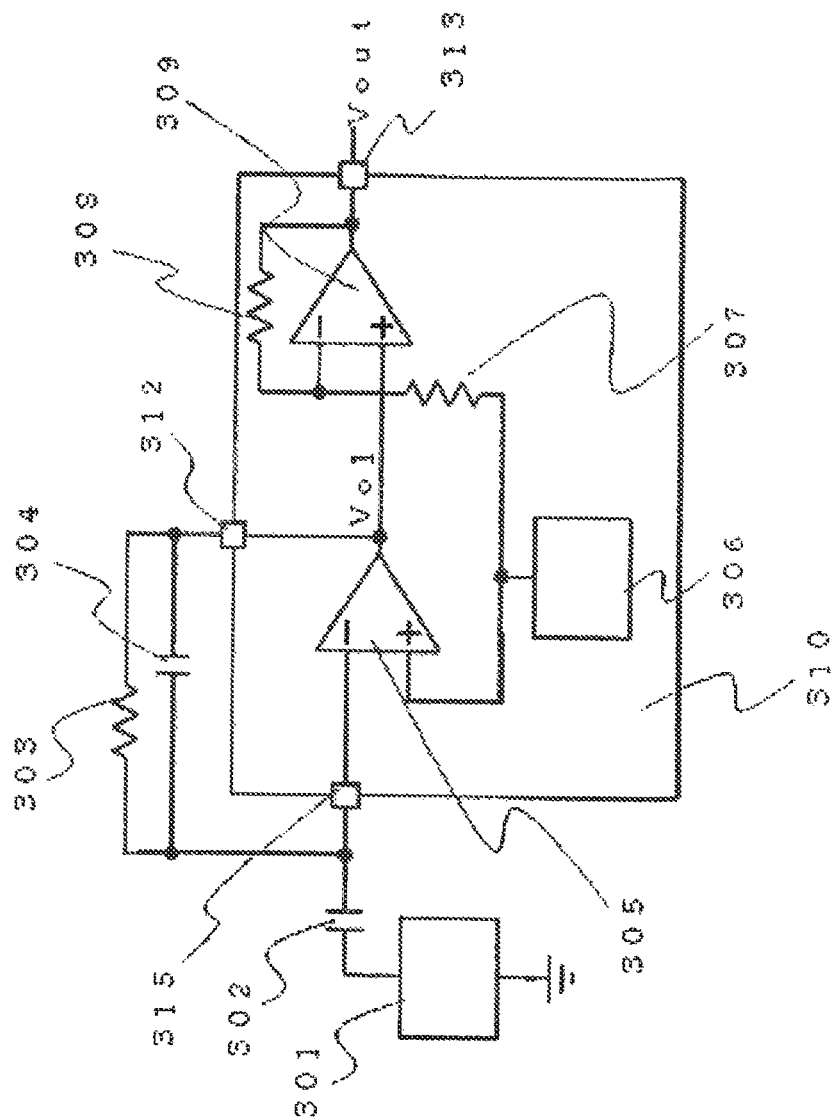
FIG. 3 is a diagram showing a configuration example of a conventional combustion pressure sensor.
Figure 4:
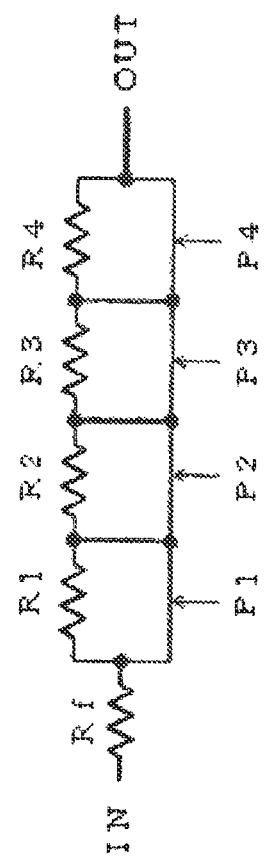
FIG. 4 is a diagram showing a specific example of a conventional amplification factor adjustment resistor.
Figure 5:
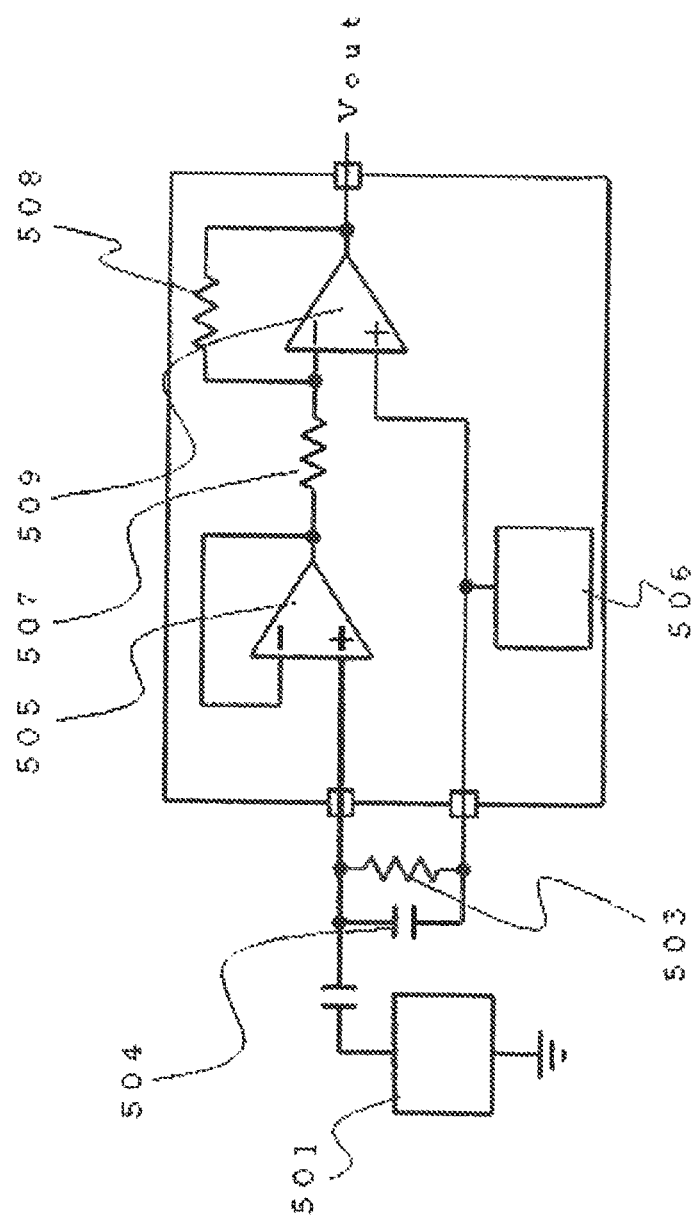
FIG. 5 is a diagram showing another configuration example of the conventional combustion pressure sensor.

FIG. 1 is a diagram showing an example of the present invention. Regarding the configuration same as that of the conventional example shown in FIG. 3, description will be given with partially omitted description. In FIG. 1, reference numeral 101 denotes a piezoelectric element, 102 denotes a DC breaking capacity, 103 denotes a discharging resistor, 104 denotes a charging capacity, 105 denotes an integrating operation amplifier, 112 denotes a feedback terminal, 113 denotes a signal output terminal, 115 denotes a signal input terminal, 106 denotes a reference voltage source, 107 denotes an amplification resistor a, 108 denotes an amplification resistor b, 109 denotes an amplifying operation amplifier, 110 denotes an integrated circuit, and 111 denotes a non-volatile memory.

The piezoelectric element 101 includes a pair of electrodes on a surface thereof, to output a charge signal from the electrodes in response to a stress applied to the piezoelectric element 101. In the piezoelectric element 101, one of the electrodes is grounded and the other electrode is connected to a negative-side input terminal of the integrating operation amplifier 105 via the DC breaking capacity 102.

In the integrating operation amplifier 105, between a negative-side input terminal and an output terminal, the charging capacity 104 and the discharging resistor 103 are connected in parallel, and the reference voltage source 106 is connected to a positive-side input terminal; accordingly, an integrating circuit is constituted by the integrating operation amplifier 105, the charging capacity 104 and the discharging resistor 103.

An AC charge signal outputted from the piezoelectric element 101 is accumulated, via the DC breaking capacity 102 for cutting the DC component, in the charging capacity 104 provided between the input and output of the integrating operation amplifier 105, to be converted into an integrated voltage signal Vo1.

The reference voltage source 106 is to apply a predetermined bias voltage to the integrating circuit and the amplifier circuit.

At a later stage of the integrating operation amplifier 105, there is provided the amplifier circuit that amplifies the output signal Vo1 of the integrating operation amplifier 105 to output an output signal Vout of the piezoelectric sensor. The amplifier circuit is constituted by the amplifying operation amplifier 109, the amplification resistor a 107 and the amplification resistor b 108, and has a configuration in which the amplification resistor b 108 is connected between the negative-side input terminal and the output terminal of the amplifying operation amplifier 109 and the reference voltage source 106 is connected to the positive-side input terminal via the amplification resistor a 107.

In the example, the integrating operation amplifier 105, the amplifying operation amplifier 109, the reference voltage source 106, the amplification resistor a 107 and the amplification resistor b 108 are formed into an integrated circuit to be configured as the integrated circuit 110. Moreover, the integrated circuit 110 is provided with the non-volatile memory 111 that stores information for setting an amplification factor of the amplifier circuit. At connection points between the integrated circuit 110 and the outside thereof, input-output terminals are provided; at the connection point between the integrating operation amplifier 105 and the piezoelectric element 101, there is provided the signal input terminal 115, at the connection point between the output of the integrating operation amplifier 105 and the discharging resistor 103, the charging capacity 104, there is provided the feedback terminal 112, and, at the connection point between the output of the amplifying operation amplifier 109 and the outside, there are provided the signal output terminal 113 and further, a writing terminal 114 for writing information to the non-volatile memory 111 from the outside.

The example is characterized by including the non-volatile memory 111 that stores information for setting the amplification factor of the amplifier circuit inside the integrated circuit 110, inputting information to the non-volatile memory 111 by the writing terminal 114, and controlling a value of the amplification resistor a 107 by the information to make the amplification factor of a detection signal variable. The amplification resistor a 107 is configured with a ladder resistor to make a value thereof variable. By incorporating the non-volatile memory 111 into the integrated circuit 110, it is possible to keep a mount area of the circuit block compact.

In the example, the resistor whose value is controlled by the non-volatile memory 111 is the amplification resistor a 107; however, the configuration may be such that the value of the amplification resistor b 108 is controlled or both the amplification resistor a 107 and the amplification resistor b 108 are controlled.

The information to be stored in the non-volatile memory 111 is written by inputting serial data from the writing terminal 114 connected to the non-volatile memory 111. There are many kinds of write formats of serial data that have already been widely distributed, and therefore, the format may be appropriately selected therefrom to be adopted. The number of writing terminals 114 changes in response to the kinds of the formats; however, in general, the more the number of terminals of the write format become, the higher the writing can be done.

Figure 2:
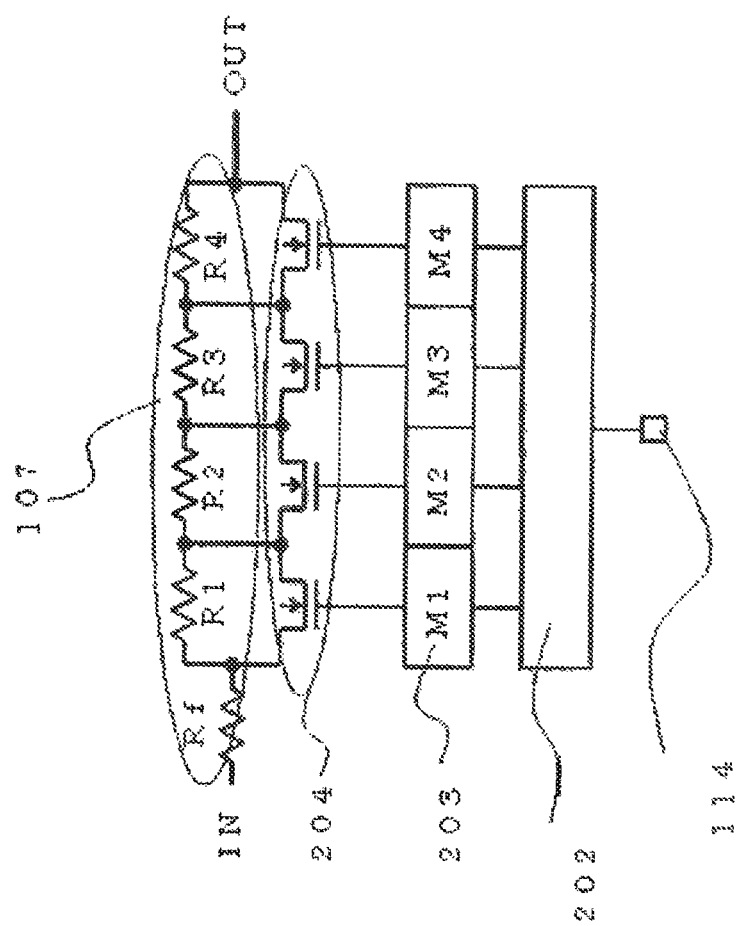
FIG. 2 is a diagram showing a configuration example that changes a resistance value in response to a memory content.

A configuration example that changes a resistance value by the non-volatile memory 111 is shown in FIG. 2. The information written from the writing terminal 114 is decoded by an address data control circuit 202 and is written to a target memory cell 203. Then, according to an output level of the memory cell 203, the semiconductor switch 204 is opened or closed, and thereby the amplification resistor a 107 is changed to a desired resistance value.

Examples of the non-volatile memory 111 include a rewritable memory, such as an EEPROM or a flash ROM, and a recordable memory, such as an OTPROM or a fuse ROM, and both types can be used in the present invention.

When the recordable memory is used, by adopting a configuration combining rewritable volatile memory and non-volatile memory, it becomes possible to correctly adjust the amplification factor. In other words, in the amplification factor adjustment process, the method is to monitor the output voltage and perform adjustment while writing the information to the volatile memory, and, at the time when the appropriate amplification factor is determined, to write a value thereof to the non-volatile memory.

Since the data writing speed of the volatile memory is much higher than that of the non-volatile memory, the above-described configuration combining the volatile memory and the non-volatile memory is useful when a rewritable non-volatile memory is used.

Figure 6:
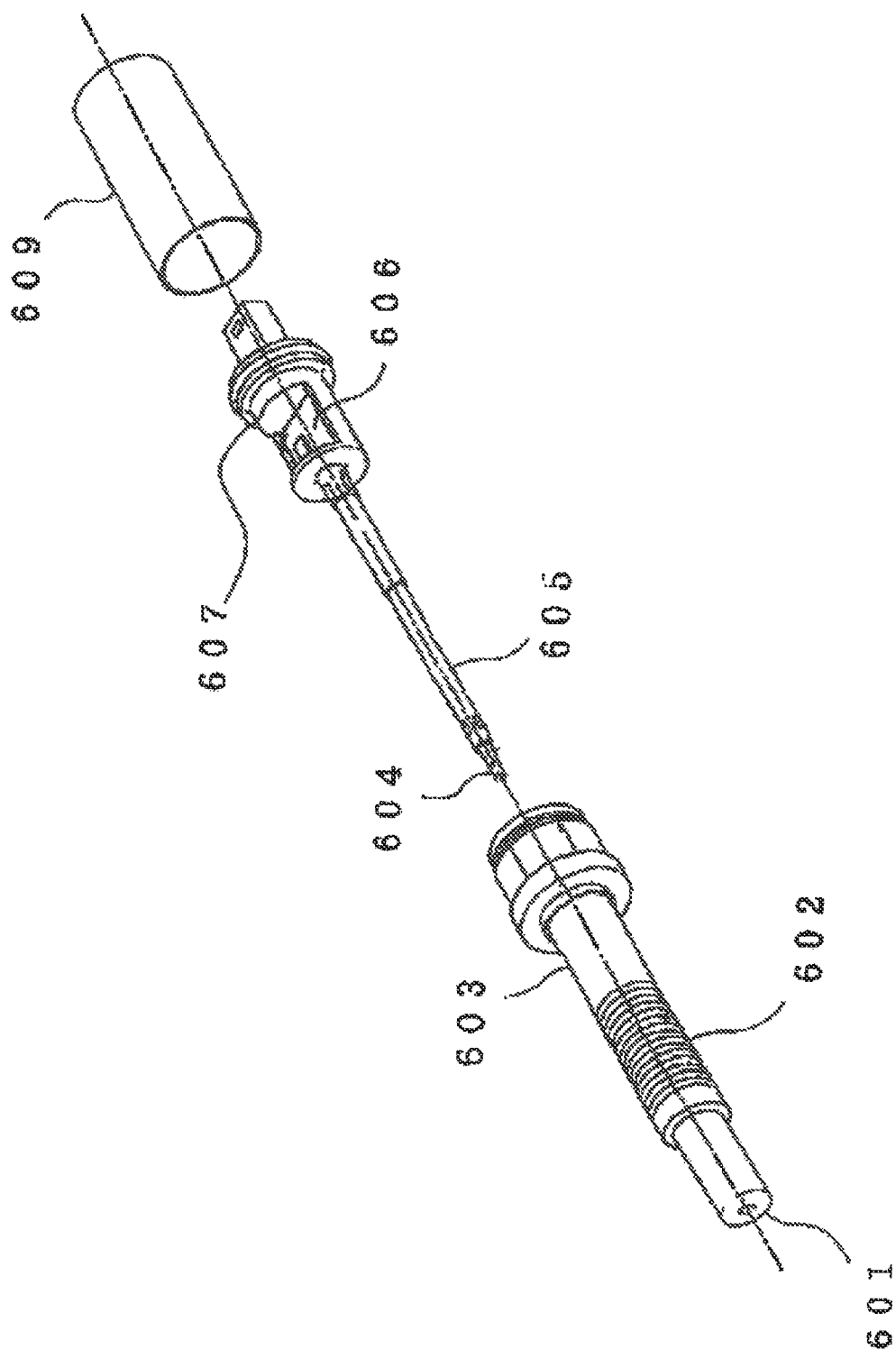
FIG. 6 is an exploded perspective view showing a mechanical configuration example of the combustion pressure sensor.
Figure 7A:
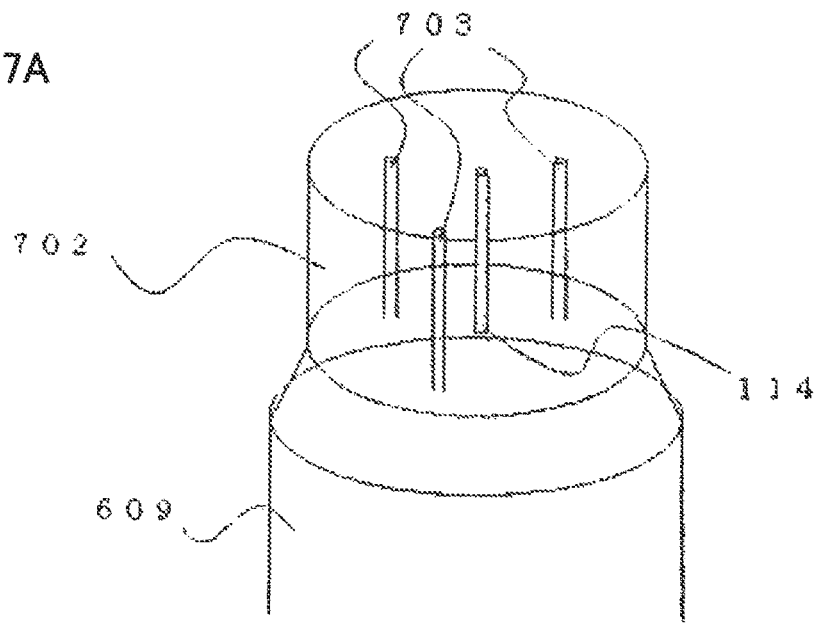
FIGS. 7A and 7B are diagrams showing connection terminal portions between the piezoelectric sensor according to the present invention and the outside.
Figure 7B:
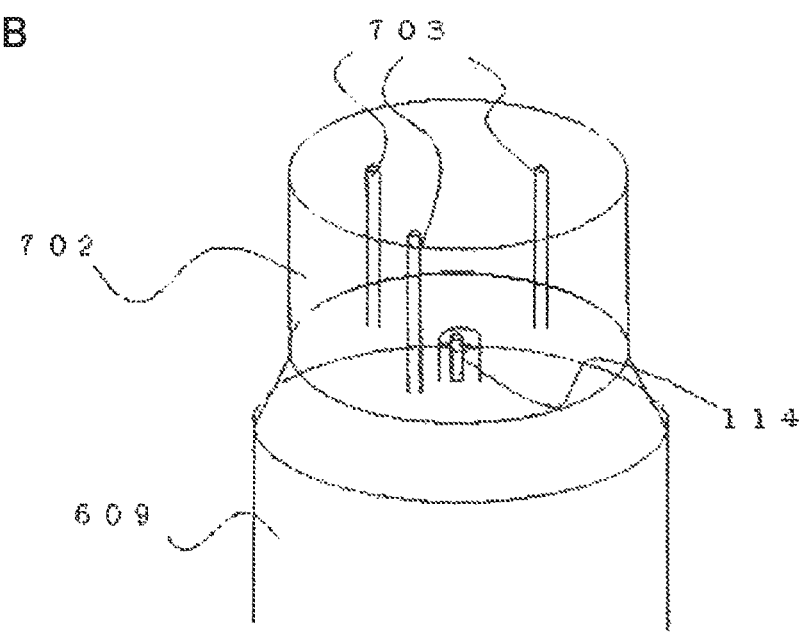

FIGS. 7A and 7B are diagrams showing the connection terminal portions between the piezoelectric sensor according to the present invention and the outside, which are specific examples each providing the connection terminal portion at an end portion on the rear housing 609 side of the combustion pressure sensor shown in FIG. 6. As shown in FIG. 7A, the connection terminal portion of the sensor includes an external-connection connector 702 provided with user terminals 703 (generally, three terminals of the supplying power supply, the supplying GND and the output signal in many cases). By also providing the writing terminal 114 to the external-connection connector 702, it becomes possible to write the amplification factor data in the state of the finished sensor.

In other words, in the amplification factor adjustment process at the time of producing, a female-side connector, which have conduction with all of the user terminals 703 and writing terminal 114, is coupled to the external-connection connector 702, and, while monitoring the output signal when the pressure is applied to the sensor by the user terminals 703, the data is written to the writing terminal 114 to adjust the amplification factor.

The writing terminal 114 is used only in the amplification factor adjustment process in producing; however, in the case of the connector in FIG. 7A, a female-side socket to be used by the user is required to have a non-conductive coupling hole corresponding to the writing terminal 114. Therefore, there is a problem that the number of terminals of the user's female-side socket is increased to result in cost rise.

The configuration of the connector shown in FIG. 7B solves the above-described problem. The writing terminal 114 is provided at a position deeper than the end of the user terminals 703; therefore, the user can use the three-terminal female connector, which is coupled only to the user terminals 703, as it is. The female connector used in the amplification factor adjustment process in producing is provided with a coupling hole, which is longer than the coupling hole to be coupled to the user terminals and which can be conductively couples to the writing terminal 114, and therefore, it is possible to have electrical conduction with the writing terminal 114 to perform amplification factor adjustment.

Note that, in the above, description was given of the case in which the sensor side included a male connector; however, a case in which the sensor side includes the female connector can be applied exactly in the same way. Moreover, in FIGS. 7A and 7B, there was provided only one writing terminal; however, plural writing terminals are also applicable in the same way.

Figure 8:
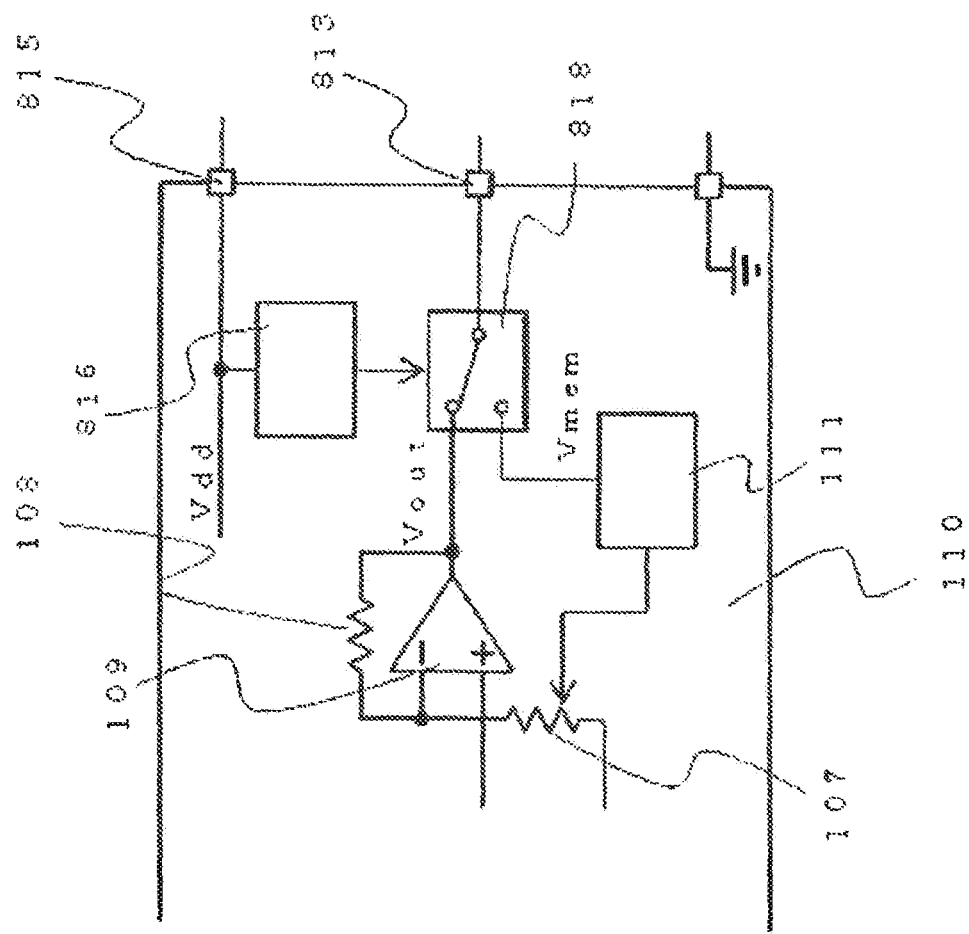
FIG. 8 is a diagram showing a configuration example when a writing terminal also serves as a user terminal.

As another method to solve the problem of the number of terminals, there is provided a configuration in which the user terminal also serves as the writing terminal to eliminate the need for a dedicated writing terminal. A configuration example of an integrated circuit corresponding to the method is shown in FIG. 8. FIG. 8 is a diagram showing another specific example of the later stage in the amplifier circuit in the example, and, since the former stage of the amplifier circuit has the same configuration as the piezoelectric sensor shown in FIG. 1, the former stage of the amplifier circuit is omitted. At the later stage of the amplifier circuit configured with the amplifying operation amplifier 109, the amplification resistor a 107 and the amplification resistor b 108, there is provided an electronic switch 818 that is switchably connected to the output of the amplifying operation amplifier 109 and the non-volatile memory 111 and is connected to a dual-purpose terminal 813. Moreover, the integrated circuit 110 is constantly supplied with a power-supply voltage Vdd from the outside via a power-supply terminal 815, and is provided with a power-supply monitoring circuit 816 connected to the constant power-supply voltage Vdd. The power-supply monitoring circuit 816 constantly monitors the power-supply voltage Vdd; when the power-supply voltage Vdd is less than a prescribed value, the electronic switch 818 is switched in a direction that connects the output of the amplifying operation amplifier 109 and the dual-purpose terminal 813, whereas, when the power-supply voltage Vdd is not less than the prescribed value, the electronic switch 818 is switched in a direction that connects the writing terminal of the non-volatile memory 111 and the dual-purpose terminal 813.

By setting the above-described prescribed voltage higher than the power-supply voltage range to be used by the user (for example, when the user power-supply voltage is 4.5V to 5.5V, the prescribed voltage is set at 6.0V), the user can always use the dual-purpose terminal 813 as the output terminal. Then, in the amplification factor adjustment process in producing, the amplification factor can be adjusted by procedures in which, first, the power-supply voltage Vdd is raised to not less than the prescribed value to write the information to the non-volatile memory 111, and next, the power-supply voltage is lowered to the user power-supply voltage, which is less than the prescribed value, to monitor the value of the output signal Vout.

Note that, in the above, description was given of a case of the single writing terminal; however, by causing the power-supply terminal to serve as the dual-purpose terminal, the case of two writing terminals is applicable.

Example 2

Figure 9:
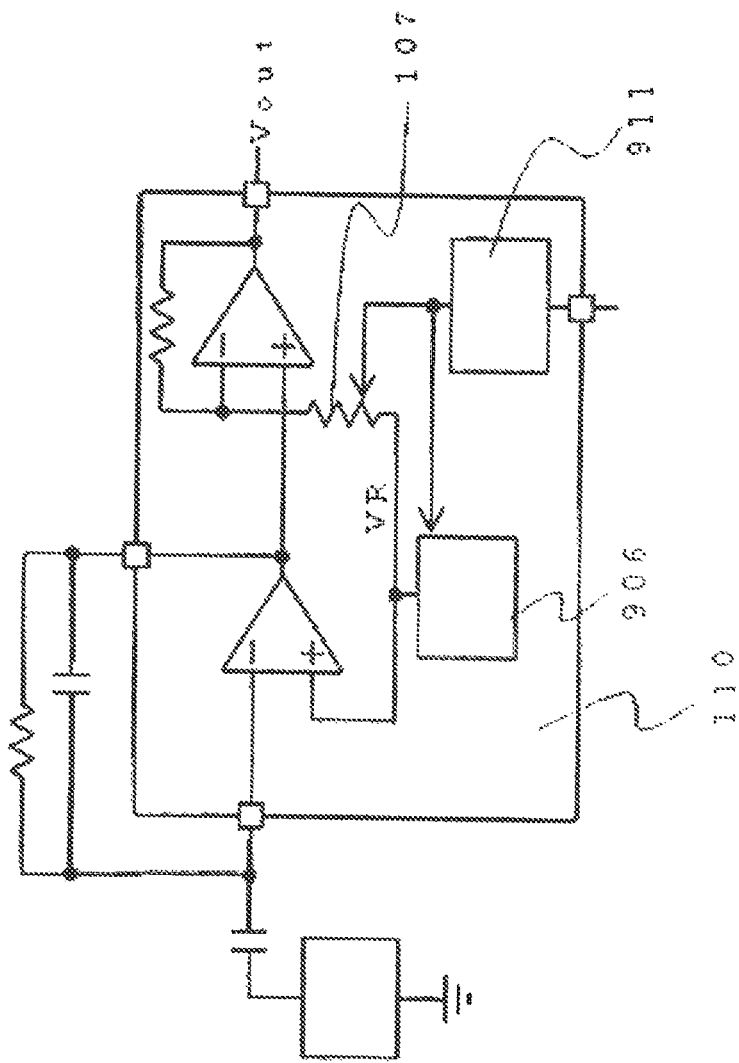
FIG. 9 is a diagram showing an example of a piezoelectric sensor according to the present invention (Example 2)

Next, another example of the piezoelectric sensor according to the present invention will be described. FIG. 9 is a diagram showing another example of the piezoelectric sensor according to the present invention. Hereinafter, regarding the portions in common with Example 1 shown in FIG. 1, description will be omitted, and the characteristic configuration of this example will be described. Moreover, regarding the configuration in common with Example 1 shown in FIG. 1, description will be given by use of the same reference signs.

In this example, inside the integrated circuit 110, there is provided a non-volatile memory 911 that is connected to the amplification resistor a 107 and a reference voltage source 906 and stores information for determining the amplification factor of the amplifier circuit and information for determining an offset voltage of the reference voltage source 906; therefore, by the information written to the non-volatile memory 911, at least one of the value of the amplification resistor a 107 and the offset voltage of the reference voltage source 906 is controlled, to thereby make the amplification factor of the detection signal variable.

The reference voltage VR outputted from the reference voltage source 906 prescribes the DC offset voltage of the output signal Vout. Normally, the reference voltage VR is constant; however, as shown in FIG. 9, by making the value of the reference voltage VR variable depending on the contents of the non-volatile memory 911, it is possible to provide a combustion pressure sensor with a higher additional value.

One of the objects to make the reference voltage VR variable is a case in which the required DC offset voltage differs depending on the user or the model. When the offset voltage is known in advance, it is possible to prepare the integrated circuit in conformity to the value, or to adjust the reference voltage value by a variable resistor; however, if the offset voltage value can be incorporated by the non-volatile memory 911 built in the integrated circuit 110, it becomes possible to use the same integrated circuit for different models, and moreover, to save effort in adjusting variable resistor by hand work.

Another object to make the reference voltage VR variable is to perform fine adjustment of the reference voltage. In general, the reference voltage source is often configured with a band-gap regulator that is less affected by production variations in semiconductors; however, in a lot or between lots of the integrated circuit, voltage variations from several millivolts to tens of millivolts occur.

If such variations in the offset voltage are not allowed on the user side, it is necessary to suppress the variations by performing fine adjustment of the reference voltage. When a pressure signal is not inputted, the DC offset voltage is outputted for the output signal Vout, and therefore, by writing data to the non-volatile memory 911 while monitoring the output signal Vout, it is possible to perform fine adjustment of the reference voltage.

Figure 10:
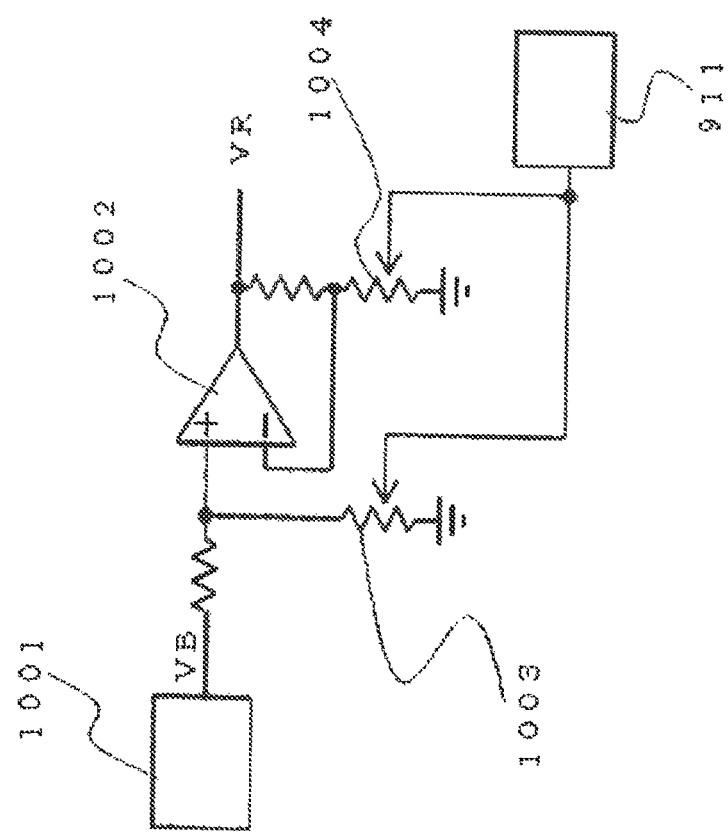
FIG. 10 is a diagram showing a configuration example that makes a reference voltage variable.

A circuit configuration example that makes the reference voltage variable is shown in FIG. 10. The reference voltage source 906 is configured with a band-gap regulator 1001, an operation amplifier 1002 and two variable resistors 1003 and 1004. The output of the band-gap regulator 1001 is connected to a positive-side input terminal of the operation amplifier 1002 and the GND potential via the variable resistor 1003, and, between a negative-side input terminal and an output terminal of the operation amplifier 1002, the variable resistor 1004 is connected. The variable resistors 1003 and 1004 are connected to the non-volatile memory 911.

The voltage VB outputted from the band-gap regulator 1001 is converted into the reference voltage VR by the operation amplifier 1002 and the two variable resistors 1003 and 1004. It becomes possible to adjust the value of the reference voltage VR by controlling the resistance values of the variable resistors 1003 and 1004 based on the signal from the non-volatile memory 911.

Between the above-described two objects to change the DC offset voltage, namely, the change for each model and the fine adjustment, accuracy and width of the adjustment significantly differ. Therefore, to make it possible to perform adjustment for both, two pairs of variable resistors may be prepared to allow coarse adjustment and fine adjustment to be separately controlled.

Example 3

In some cases, an engine combustion pressure sensor for a vehicle, as the piezoelectric sensor, is required to have an output voltage clip function. This is a function of performing voltage clip control to the voltage exceeding an upper limit voltage and a lower limit voltage that have been predetermined and causing the sensor to output a voltage within a range from the lower limit to the upper limit of the voltage, the function being used for fault diagnosis of the sensor. When a voltage out of the clip voltage range is monitored by an engine-side ECU that receives the sensor output, occurrence of abnormal situations, such as a fault in sensor or cable disconnection, is assumed.

Figure 11A:
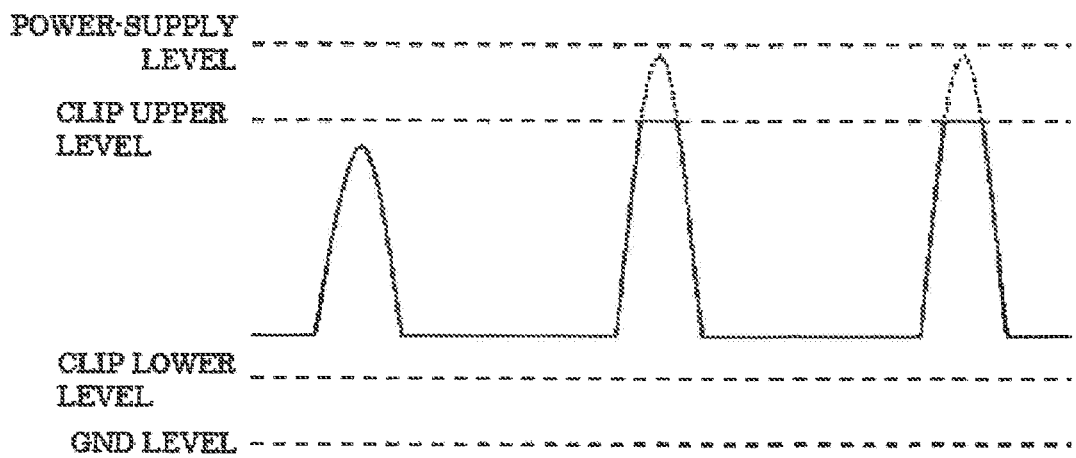
FIGS. 11A and 11B are diagrams for illustrating a combustion pressure sensor having a clip function.
Figure 11B:
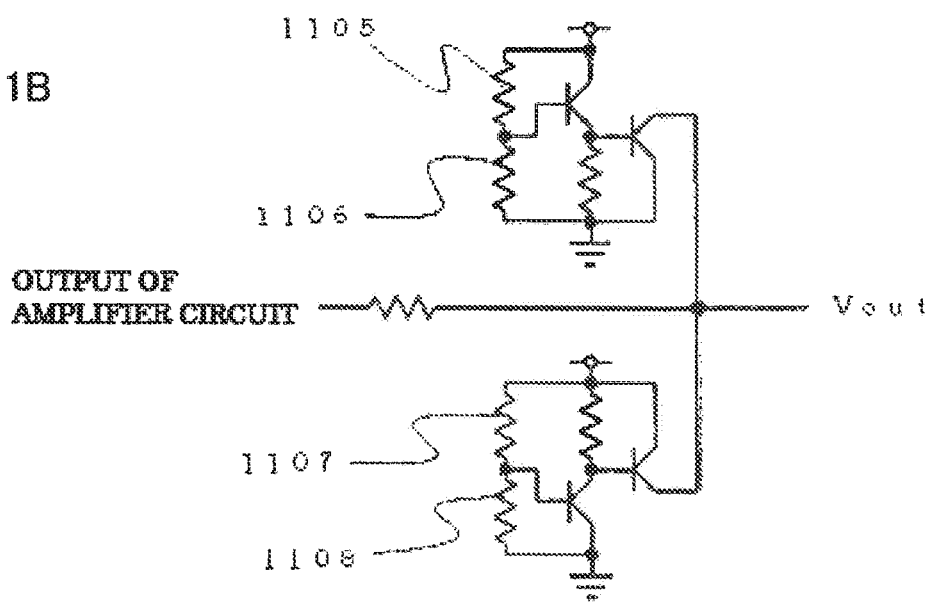

FIGS. 11A and 11B are diagrams for illustrating the combustion pressure sensor having the clip function; FIG. 11A is a graph showing a specific example of the output voltage from the combustion pressure sensor having the clip function, and FIG. 11B is a diagram showing a specific example of a voltage clip circuit. In FIG. 11A, the solid line indicates the output voltage, in which, when a waveform exceeds the clip upper limit voltage, it is indicated that the voltage is clipped to the upper limit voltage to be outputted.

FIG. 11B is a circuit diagram showing a specific example of a voltage clip circuit using a bipolar transistor, in which, in the figure, an upper limit clip circuit is provided at an upper stage and a lower limit clip circuit is provided at a lower stage with respect to the output of the amplifier circuit.

In the upper limit clip circuit, a gate of an npn transistor is connected to a connection point of resistors 1105 and 1106 that are connected in series between the power-supply voltage Vdd (not shown) and the GND, a collector of the npn transistor is connected to the power-supply voltage Vdd, and an emitter thereof is connected to the GND via a resistor. The emitter of the npn transistor is connected to a base of a pnp transistor. Then, a collector of the pnp transistor is connected to the GND and an emitter thereof is connected to the amplifier circuit output line. The configuration draws the base-emitter voltage of the npn transistor into the divided voltage of the resistors 1105 and 1106 and adds the base-emitter voltage of the pnp transistor to set the maximum prescribed voltage.

Moreover, in the lower-side clip circuit, a gate of the pnp transistor is connected to a connection point of resistors 1107 and 1108 that are connected in series between the power-supply voltage Vdd (not shown) and the GND, the collector of the pnp transistor is connected to the GND, and the emitter thereof is connected to the power-supply voltage Vdd via a resistor. The emitter of the pnp transistor is connected to a base of the npn transistor. Then, the collector of the npn transistor is connected to the power-supply voltage Vdd and the emitter thereof is connected to the amplifier circuit output line. In the configuration, the divided voltage of the resistors 1107 and 1108 is substantially the same as the minimum prescribed voltage.

Figure 12:
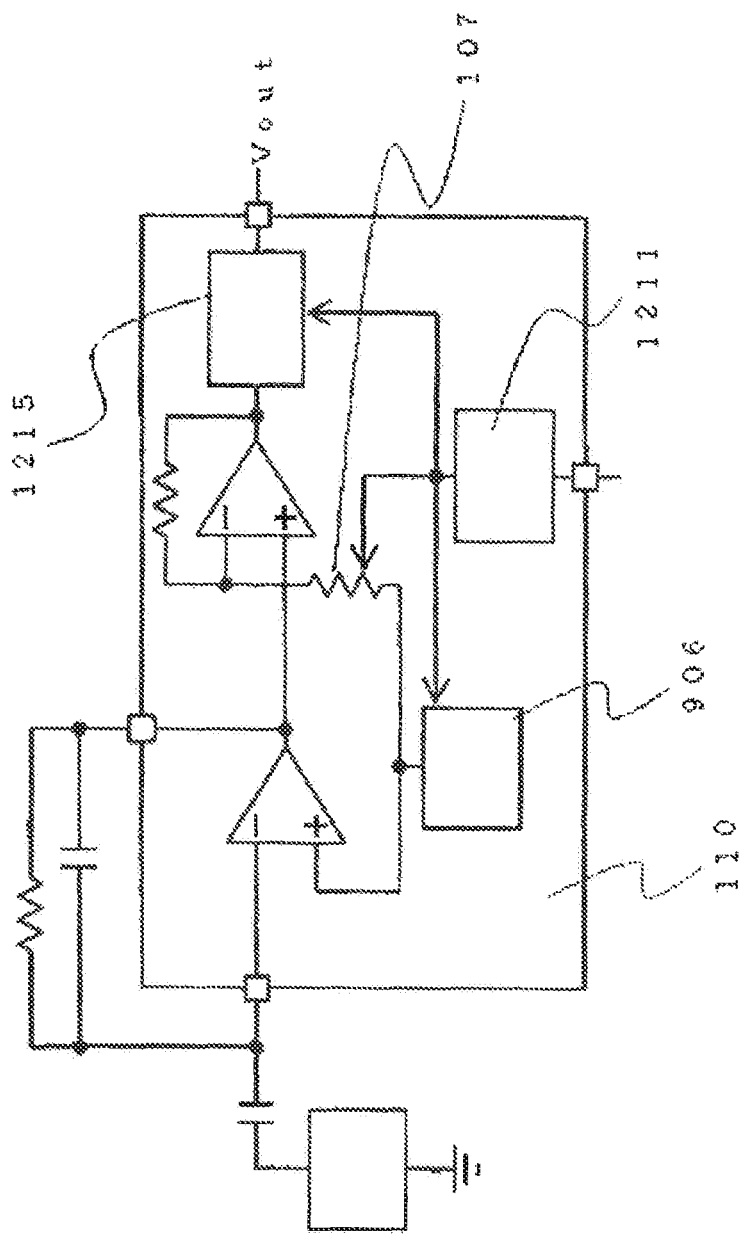
FIG. 12 is a diagram showing an example of a piezoelectric sensor according to the present invention (Example 3).

Normally, the clip voltage is constant; however, similar to the offset voltage described in Example 2, by making the value of the clip voltage variable depending on the contents of the non-volatile memory, it is possible to provide a combustion pressure sensor with a higher additional value. A configuration example is shown in FIG. 12.

The objects of making the clip voltage variable are, similar to the offset voltage described in Example 2, to cover differences in setting due to the models and to respond to fine adjustment. In the case of the clip circuit shown in FIG. 11B, the clip voltage can be varied by changing values of the resistors 1105, 1106, 1107 and 1108. FIG. 12 is a diagram showing another example of the piezoelectric sensor according to the present invention. Hereinafter, regarding the portions in common with Examples 1 and 2 shown in FIGS. 1 and 9, description will be omitted, and the characteristic configuration of this example will be described. Moreover, regarding the configuration in common with Example 1 shown in FIG. 1, description will be given by use of the same reference signs. In the Example, inside the integrated circuit 110 and at the later stage of the amplifier circuit, a clip circuit 1215 and a non-volatile memory 1211 are provided. The non-volatile memory 1211 is connected to the amplification resistor a 107, the reference voltage source 906 and the clip circuit 1215, stores information for determining the amplification factor of the amplifier circuit, information for determining the offset voltage of the reference voltage source 906 and information for determining a clip voltage of the clip circuit 1215; therefore, by the information written to the non-volatile memory 1211, at least one of the value of the amplification resistor a 107, the offset voltage of the reference voltage source 906 and the clip voltage of the clip circuit 1215 is controlled, to thereby make the amplification factor of the detection signal variable. To control the clip voltage of the clip circuit 1215, the clip circuit 1215 is formed by setting any one of the resistors 1105, 1106, 1107 and 1108 in the voltage clip circuit shown in FIG. 11B to be a variable resistor, and then the resistance value in the clip circuit 1215 may be varied by the information stored in the non-volatile memory 1211.

So far, the present invention has been described based on three examples; however, the piezoelectric sensor according to the present invention is not limited to the examples and also includes various modifications added to the above-described examples within the scope not departing from the gist of the present invention.

REFERENCE SIGNS LIST

101, 310, 501 . . . Piezoelectric element
102, 302 . . . DC breaking capacity
103, 303, 503 . . . Discharging resistor
104, 304, 504 . . . Charging capacity
105, 305, 505 . . . Integrating operation amplifier
106, 306, 506, 906 . . . Reference voltage source
107, 307, 507 . . . Amplification resistor a
108, 308, 508 . . . Amplification resistor b
109, 309, 509 . . . Amplifying operation amplifier
110, 310 . . . Integrated circuit
111, 911, 1211 . . . Non-volatile memory
112, 312 . . . Feedback terminal
113, 313 . . . Signal output terminal
114 . . . Writing terminal
115, 315 . . . Signal input terminal
202 . . . Address data control circuit
203 . . . Memory cell
204 . . . Semiconductor switch
601 . . . Diaphragm head
602 . . . Fastening screw
603 . . . Front housing
604 . . . Piezoelectric element
605 . . . Conductive wire
606 . . . Circuit board
607 . . . Circuit case
609 . . . Rear housing
702 . . . External-connection connector
703 . . . User terminal
813 . . . Dual-purpose terminal
815 . . . Power-supply terminal
816 . . . Power-supply monitoring circuit
818 . . . Electronic switch
1001 . . . Band-gap regulator
1002 . . . Operation amplifier
1003, 1004 . . . Variable resistor
1105, 1106, 1107, 1108 . . . Resistor
1215 . . . Clip circuit

The invention claimed is:

1. A piezoelectric sensor comprising: a piezoelectric element for detecting a pressure; an integrating circuit that integrates a current signal outputted from the piezoelectric element to convert the current signal into a voltage signal; an amplifier circuit that amplifies an output from the integrating circuit to output thereof to outside; a reference voltage source that prescribes an offset voltage of an output signal outputted from the amplifier circuit; a writable memory that stores information for setting an amplification factor of the amplifier circuit; a writing terminal for writing the information to the memory, and three user terminals for supplying a power to the piezoelectric sensor, supplying a GND to the piezoelectric sensor and outputting the output signal from the piezoelectric sensor, wherein the writing terminal is separated from the three user terminals; wherein the writing terminal and the three user terminals are provided to an external-connection connector that connects the piezoelectric sensor and the outside, and the writing terminal is provided at a position deeper in the external-connection connector than an end of the three user terminals.

2. A piezoelectric sensor comprising: a piezoelectric element for detecting a pressure; an integrating circuit that integrates a current signal outputted from the piezoelectric element to convert the current signal into a voltage signal; an amplifier circuit that amplifies an output from the integrating circuit to output thereof to outside; a reference voltage source that prescribes an offset voltage of an output signal outputted from the amplifier circuit; a writable memory that stores information for setting the offset voltage of the reference voltage source; and a writing terminal for writing the information to the memory, and three user terminals for supplying a power to the piezoelectric sensor, supplying a GND to the piezoelectric sensor and outputting the output signal from the piezoelectric sensor, wherein the writing terminal is separated from the three user terminals; wherein the writing terminal and the three user terminals are provided to an external-connection connector that connects the piezoelectric sensor and the outside, and the writing terminal is provided at a position deeper in the external-connection connector than an end of the three user terminals.

3. A piezoelectric sensor comprising: a piezoelectric element for detecting a pressure; an integrating circuit that integrates a current signal outputted from the piezoelectric element to convert the current signal into a voltage signal; an amplifier circuit that amplifies an output from the integrating circuit to output thereof to outside; a reference voltage source that prescribes an offset voltage of an output signal outputted from the amplifier circuit; a clip circuit for limiting an output from the amplifier circuit within a prescribed range; a writable memory that stores information for setting a clip voltage of the clip circuit; a writing terminal for writing the information to the memory, and three user terminals for supplying a power to the piezoelectric sensor, supplying a GND to the piezoelectric sensor and outputting the output signal from the piezoelectric sensor, wherein the writing terminal is separated from the three user terminals; wherein the writing terminal and the three user terminals are provided to an external-connection connector that connects the piezoelectric sensor and the outside, and the writing terminal is provided at a position deeper in the external-connection connector than an end of the three user terminals.

* * * * *